United States Patent [19]
Heilmann et al.

[11] Patent Number: 5,831,487
[45] Date of Patent: Nov. 3, 1998

[54] OSCILLATOR CIRCUIT

[75] Inventors: Thomas Heilmann, Munich, Germany; Adam Bexley, Hook, Great Britain

[73] Assignee: Siemens Aktiengesellschaft, Munich, Germany

[21] Appl. No.: 805,327

[22] Filed: Feb. 24, 1997

[30] Foreign Application Priority Data

Feb. 22, 1996 [DE] Germany .................. 196 06 684.0

[51] Int. Cl.$^6$ .............................. H03B 7/14; H05B 7/00
[52] U.S. Cl. ............... 331/117 D; 331/96; 331/107 SL; 331/117 R
[58] Field of Search .................. 331/107 SL, 117 R, 331/107 R, 108 R, 108 C, 117 D, 96, 99

[56] References Cited

U.S. PATENT DOCUMENTS

| | | | |
|---|---|---|---|
| 3,624,541 | 11/1971 | Lundstrom | 331/65 |
| 4,353,038 | 10/1982 | Rose et al. | 331/36 C |
| 4,758,922 | 7/1988 | Ishigaki et al. | 331/107 SL |
| 5,113,155 | 5/1992 | Funada | 331/107 SL |
| 5,138,284 | 8/1992 | Yabuki et al. | 331/56 |
| 5,402,087 | 3/1995 | Gorczak | 331/114 |
| 5,483,206 | 1/1996 | Lohninger | 331/107 SL |

FOREIGN PATENT DOCUMENTS

| | | |
|---|---|---|
| 2815570 | 10/1979 | Germany . |
| 1414660 | 11/1975 | United Kingdom . |

OTHER PUBLICATIONS

Patent Abstracts of Japan No. JP 4–22201 A (Tamura), dated Jan. 27, 1992.

"Electronic Circuits–Design and Applications", U. Tietze et al., pp. 413–414.

"Integrierte Schaltungen für die Unterhaltungselektronik Datenbuch 1986/87", pp. 43–48.

*Primary Examiner*—Son T. Dinh
*Attorney, Agent, or Firm*—Herbert L. Lerner; Laurence A. Greenberg

[57] ABSTRACT

An oscillator circuit includes a resonant circuit having a capacitor and an inductor. The inductor has two main terminals, a center tap and two further taps disposed symmetrically relative to the center tap. The inductor is constructed as a U-shaped stripline in which the center tap is disposed at a turning point of the U-shaped stripline, the main terminals are disposed at ends of legs of the U-shaped stripline and the further taps are each located at the same distance from an end of a respective leg.

5 Claims, 1 Drawing Sheet

OSCILLATOR CIRCUIT

BACKGROUND OF THE INVENTION

FIELD OF THE INVENTION

The invention relates to an oscillator circuit.

Symmetrical oscillators in a capacitive three-point circuit, so-called symmetrical Collpit oscillators, were heretofore used in particular in integrated circuits for radio-frequency applications. Such an integrated circuit is, for example, the Type S 042 of the firm Siemens, which is described, for example, in the data book entitled "Integrierte Schaltungen für die Unterhaltungselektronik 1986/1987" [Integrated Circuits for Consumer Electronics 1986/1987], pages 43 to 48. In principle, such a Collpit oscillator includes two transistors having bases and collectors which are each connected to a supply voltage through a resistor and having emitters that are each connected through a resistor to a reference potential. In that configuration, a capacitor is connected in each case between the base and the emitter of the two transistors and a further capacitor is placed between the emitters of the two transistors. A resonant circuit is furthermore disposed between the bases of the two transistors.

The advantage in that type of oscillator is that the coil does not need any taps, or only a few taps, which are additionally not critical with regard to their accuracy. However, it is disadvantageous that the emitter resistors of the two transistors damp the resonant circuit and thus cause an increased far-off phase noise.

Symmetrical oscillators in an inductive three-point circuit, so-called Hartley oscillators, are substantially more favorable with regard to the far-off phase noise. Just like the basic principle of the Collpit oscillator, the basic principle of the Hartley oscillator is described, for example, in the book by U. Tietze and C. Schenk, entitled "Electronic Circuits-Design and Applications", pages 413 and 414. It is disadvantageous in Hartley oscillators that, in particular in the case of symmetrical structures, high demands are placed on the inductor of the resonant circuit and, in particular, on the accuracy of the taps. The production of such inductors for the radio-frequency band therefore requires a comparatively high outlay.

SUMMARY OF THE INVENTION

It is accordingly an object of the invention to provide an oscillator circuit, which overcomes the hereinaforementioned disadvantages of the heretofore-known devices of this general type and in which the outlay for production is low despite the use of inductors with taps.

With the foregoing and other objects in view there is provided, in accordance with the invention, an oscillator circuit, comprising a resonant circuit having a capacitor and an inductor; the inductor being constructed as a U-shaped stripline having legs with ends and a turning point between the legs; and the inductor having two main terminals disposed at the ends of the legs of the U-shaped stripline, a center tap disposed at the turning point of the U-shaped stripline, and two further taps disposed symmetrically relative to the center tap and equidistant from the respective ends of the legs.

In accordance with another feature of the invention, the oscillator circuit is symmetrically constructed and operates in accordance with the Hartley principle.

In accordance with a further feature of the invention, the center tap is connected through a resistor to a reference potential, and the further taps are each connected to the emitter of one of the two transistors. In this configuration, on one hand the main terminals of the U-shaped stripline are connected to one another through the capacitor, and on the other hand they are each connected through one further capacitor to the base of one of the two transistors. Moreover, the bases and collectors of the two transistors are each connected to a supply potential through one further resistor. It is also possible in the same way to use current-limiting elements or current sources instead of the resistors.

In accordance with an added feature of the invention, the oscillator is used in an integrated circuit.

In accordance with a concomitant feature of the invention, the U-shaped stripline is disposed below the integrated circuit.

The advantage of a U-shaped construction of the stripline resides, on one hand, in a placement of the center tap and of the further taps which can be carried out with high accuracy, with ease, with a high degree of symmetry and with very good reproducibility. The advantage of the inductive three-point circuit resides, in turn, in a low ohmic loading of the resonant circuit, since the common emitter resistance is not effective in terms of alternating voltage, and this leads to an improved far-off phase noise. Finally, the configuration of the U-shaped stripline below an integrated circuit has the advantage of a screening effect by the integrated circuit.

Other features which are considered as characteristic for the invention are set forth in the appended claims.

Although the invention is illustrated and described herein as embodied in an oscillator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
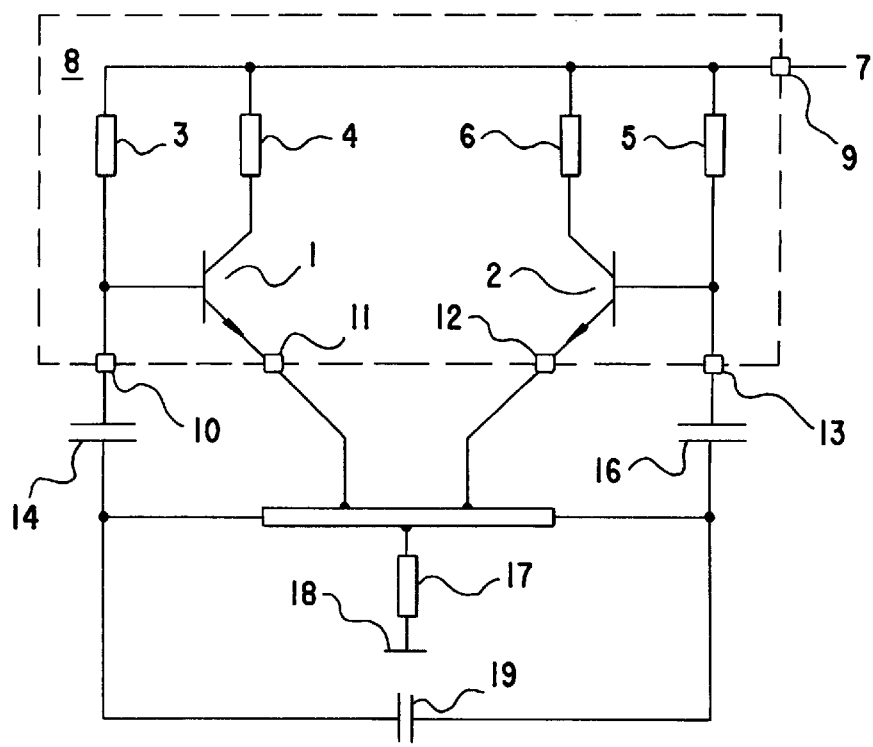
FIG. 1 is a schematic circuit diagram of an oscillator according to the invention.

Referring now to the figures of the drawings in detail and first, particularly, to FIG. 1 thereof, there is seen a symmetrical Hartley oscillator which is the starting point for an exemplary embodiment of the invention. The Hartley oscillator includes two bipolar transistors 1 and 2 of the npn type. The transistor 1 has a base and a collector which are connected through respective resistors 3 and 4 to a supply potential 7. The transistor 2 has a base and a collector which are connected in the same way through respective resistors 5 and 6 to the supply potential 7. The transistors 1 and 2 and the resistors 3 to 6 are cointegrated into an integrated circuit 8. However, the integrated circuit 8 includes further circuit elements which, for the sake of clarity, are not represented in detail. This supply potential 7 is fed through a terminal 9 to parts of the oscillator circuit according to the invention which are contained in the integrated circuit 8.

Furthermore, the base and the emitter of the transistor 1 and the emitter and the base of the transistor 2 are each connected to the outside through one respective terminal 10, 11, 12 and 13. The terminal 10 which is connected to the base of the transistor 1 is coupled externally through a capacitor 14 to a main terminal of an inductor 15. Another main terminal of the inductor 15 is coupled through a capacitor 16 to the terminal 13 of the integrated circuit 8, which is the terminal that is connected to the base of the transistor 2.

Moreover, the inductor 15 has a center tap which is coupled through a resistor 17 to a reference potential 18. However, in the case of the inductor 15, two further taps are provided which are disposed symmetrically relative to the center tap. These further taps are connected to the terminals 11 and 12 of the integrated circuit 8, which are the terminals that are respectively connected inside the integrated circuit 8 to the emitter of the transistor 1 and to the emitter of the transistor 2. Finally, a capacitor 19 which forms a resonant circuit together with the inductor 15, is connected between the two main terminals of the inductor 15.

Figure 2:
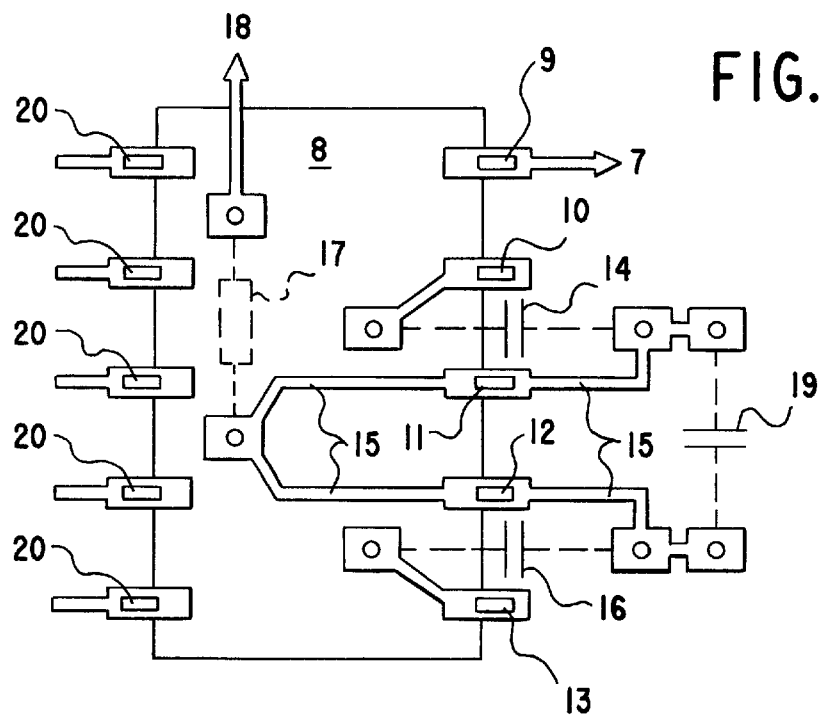
FIG. 2 is a diagrammatic, plan view showing the structure of an inductor in the oscillator according to FIG. 1.

In accordance with FIG. 2, the circuit configuration according to FIG. 1 is mechanically constructed, for example, in such a way that the integrated circuit 8 includes a dual inline package with ten terminals. In addition to the terminals 9 to 13, which are situated in a row, further terminals 20 are provided, which are situated in a row opposite thereto. The terminals 20 and 9 to 13 are soldered on one side of a non-illustrated printed circuit board to appropriate conductor tracks. The conductor tracks are represented in the drawing by corresponding rectangular areas.

According to the invention, in this configuration, the inductor 15 is constructed as a U-shaped stripline having two mutually parallel conductor tracks which form legs of the U-shaped stripline. On one hand, the conductor tracks respectively run up acutely to a common connection pad and on the other hand they lead respectively away from one another in an angled-off fashion to a respective connection pad. The common connection pad serves to fasten a terminal of the resistor 17. Another terminal of the resistor 17 is likewise connected through a corresponding connection pad and a conductor track to the reference potential 18. On one hand, the connection pads at the respective ends of the legs are each connected through a respective conductor track to one of two further connection pads between which the capacitor 19 is connected. The respective connection pads provided directly at the ends of the legs of the U-shaped stripline 15 are each connected to a terminal of a respective one of the capacitors 14, 16. The other terminals of the respective capacitors 14, 16 are each connected to a connection pad connected through a conductor track to a respective terminal 10, 13 of the integrated circuit 8.

In the exemplary embodiment, the U-shaped stripline 15 is disposed in such a way that it is partially covered by the integrated circuit 8. However, given an appropriate configuration of the terminals 11, 12 of the integrated circuit 8, it is also possible in the same way to have a configuration in which the U-shaped stripline 15 is virtually completely covered by the integrated circuit 8.

In this case, the integrated circuit 8 is soldered directly on the connection pads on one side of the non-illustrated printed circuit board, while the capacitors 14, 16 and 19 and the resistor 17 are disposed on the other side of the printed circuit board and fastening is performed in such a way that terminals of the capacitors 14, 16 and 19 as well as of the resistor 17 are guided through bores in the region of the connection pads and firmly soldered to the latter. The further taps of the inductor 15 are thus produced by soldering in the integrated circuit 8 at the appropriate point. It is preferred in this configuration for the two terminals 11 and 12 of the integrated circuit 8, which are connected to the emitters of the transistors 1 and 2, to be situated directly next to one another. However, it is also possible for terminals of the integrated circuit 8 which are not radio-frequency terminals to be located between these two terminals 11 and 12. The illustrated configuration of the exemplary embodiment having the terminals 11 and 12 situated directly next to one another as well as having the terminals 10 and 13 located directly next to the terminals 11 and 12 and connected to the bases of the transistors 1 and 2, permits a very compact construction of the oscillator circuit as well as an extremely short conductor configuration which keeps undesired external influences as slight as possible.

Due to a high degree of compactness, the oscillator circuit according to the invention is thus distinguished by a lower sensitivity with respect to external influences, good self-screening, low noise and high reproducibility. The stripline itself can be produced with high accuracy and reproducibility, as well as in a simple way.

We claim:

1. An oscillator circuit, comprising:

a resonant circuit having a capacitor and an inductor;

said inductor being constructed as a U-shaped stripline having legs with ends and a turning point between said legs; and said inductor having two main terminals disposed at said ends of said legs of said U-shaped stripline, a center tap disposed at said turning point of said U-shaped stripline, and two further taps disposed symmetrically relative to said center tap and equidistant from said respective ends of said legs.

2. A symmetrical Hartley type oscillator circuit, comprising:

a resonant circuit having a capacitor and an inductor;

said inductor being constructed as a U-shaped stripline having legs with ends and a turning point between said legs; and said inductor having two main terminals disposed at said ends of said legs of said U-shaped stripline, a center tap disposed at said turning point of said U-shaped stripline, and two further taps disposed symmetrically relative to said center tap and equidistant from said respective ends of said legs.

3. The oscillator circuit according to claim 2, including:

a resistor connecting said center tap to a reference potential;

two transistors each having an emitter, a collector and a base;

each of said further taps being connected to the emitter of a respective one of said transistors;

said capacitor being connected between said main terminals of said inductor;

further capacitors each connected between a respective one of said main terminals of said inductor and the base of a respective one of said transistors; and resistors each connecting a respective one of the bases and the collectors of said transistors to a supply potential.

4. An oscillator assembly, comprising:

an integrated circuit; and an oscillator circuit at least partially integrated into said integrated circuit, said oscillator circuit having a resonant circuit with a capacitor and an inductor;

said inductor being constructed as a U-shaped stripline having legs with ends and a turning point between said legs; and said inductor having two main terminals disposed at said ends of said legs of said U-shaped stripline, a center tap disposed at said turning point of said U-shaped stripline, and two further taps disposed symmetrically relative to said center tap and equidistant from said respective ends of said legs.

5. The oscillator assembly according to claim 4, wherein said U-shaped stripline is disposed below said integrated circuit.

* * * * *